United States Patent
Thurmer et al.

(10) Patent No.: US 9,646,838 B2
(45) Date of Patent: May 9, 2017

(54) METHOD OF FORMING A SEMICONDUCTOR STRUCTURE INCLUDING SILICIDED AND NON-SILICIDED CIRCUIT ELEMENTS

(71) Applicant: GLOBALFOUNDRIES Inc., Grand Cayman (KY)

(72) Inventors: Dominic Thurmer, Dresden (DE); Sven Metzger, Dresden (DE); Joachim Patzer, Langebrueck (DE); Markus Lenski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 331 days.

(21) Appl. No.: 14/293,627

(22) Filed: Jun. 2, 2014

(65) Prior Publication Data

US 2015/0031179 A1    Jan. 29, 2015

(30) Foreign Application Priority Data

Jul. 24, 2013    (DE) .................. 10 2013 214 436

(51) Int. Cl.
*H01L 21/8234* (2006.01)
*H01L 21/283* (2006.01)
(Continued)

(52) U.S. Cl.
CPC .... *H01L 21/283* (2013.01); *H01L 21/823412* (2013.01); *H01L 21/823418* (2013.01);
(Continued)

(58) Field of Classification Search
CPC ..... H01L 21/823807; H01L 21/823864; H01L 29/7843; H01L 21/283; H01L 21/823418;
(Continued)

(56) References Cited

U.S. PATENT DOCUMENTS 7,795,644 B2    9/2010  Wang et al.
8,338,245 B2   12/2012  Lee et al.
(Continued)

FOREIGN PATENT DOCUMENTS

CN    101217145 A    7/2008

OTHER PUBLICATIONS

Translation of Official Communication from German Patent Application No. 10 2013 214 436.9 dated Jan. 29, 2014.
(Continued)

*Primary Examiner* — Julio J Maldonado
*Assistant Examiner* — Joseph Galvin, III
(74) *Attorney, Agent, or Firm* — Amerson Law Firm, PLLC

(57) ABSTRACT

A method includes providing a semiconductor structure including at least one first circuit element including a first semiconductor material and at least one second circuit element including a second semiconductor material. A dielectric layer having an intrinsic stress is formed that includes a first portion over the at least one first circuit element and a second portion over the at least one second circuit element. A first annealing process is performed, wherein an intrinsic stress is created at least in the first semiconductor material by stress memorization, and thereafter the first portion of the dielectric layer is removed. A layer of a metal is formed, and a second annealing process is performed, wherein the metal and the first semiconductor material react chemically to form a silicide. The second portion of the dielectric layer substantially prevents a chemical reaction between the second semiconductor material and the metal.

27 Claims, 6 Drawing Sheets

(51) Int. Cl.
*H01L 27/06* (2006.01)
*H01L 21/268* (2006.01)
*H01L 29/66* (2006.01)
*H01L 29/78* (2006.01)
*H01L 27/11* (2006.01)
*H01L 21/285* (2006.01)

(52) U.S. Cl.
CPC ...... H01L 27/0629 (2013.01); H01L 29/7847 (2013.01); *H01L 21/268* (2013.01); *H01L 21/28518* (2013.01); *H01L 27/1104* (2013.01); *H01L 29/665* (2013.01); *H01L 29/7843* (2013.01)

(58) Field of Classification Search
CPC ........... H01L 21/823412; H01L 21/268; H01L 27/0629; H01L 27/1104; H01L 29/7847; H01L 29/665; H01L 21/28518
USPC ........................................................ 438/238
See application file for complete search history.

(56) References Cited

U.S. PATENT DOCUMENTS

| | | | |
|---|---|---|---|
| 2008/0164530 A1* | 7/2008 | Wang et al. ................ | 257/369 |
| 2008/0173934 A1 | 7/2008 | Lee et al. | |
| 2008/0305601 A1* | 12/2008 | Chen .......................... | 438/308 |
| 2009/0166618 A1* | 7/2009 | Mowry ................... | H01L 22/34 |
| | | | 257/48 |
| 2009/0197381 A1* | 8/2009 | Lenski ........... | H01L 21/823807 |
| | | | 438/278 |
| 2009/0221117 A1* | 9/2009 | Tan et al. ...................... | 438/238 |
| 2009/0246926 A1* | 10/2009 | Gehring ........... | H01L 21/26513 |
| | | | 438/305 |
| 2009/0298249 A1* | 12/2009 | Hoentschel ....... | H01L 21/26506 |
| | | | 438/302 |
| 2012/0196421 A1* | 8/2012 | Chang et al. ................. | 438/303 |
| 2013/0149849 A1* | 6/2013 | Nandakumar .... | H01L 21/26513 |
| | | | 438/532 |

OTHER PUBLICATIONS

Translation of Official Communication from Chinese Patent Application No. 201410352843.8 dated Oct. 10, 2016.
Translation of Official Communication from Taiwan Patent Application No. 103117100 dated Jul. 12, 2016.
Translation of Official Communication from German Patent Application No. 10 2013 214 436.9 dated Feb. 5, 2016.

* cited by examiner

METHOD OF FORMING A SEMICONDUCTOR STRUCTURE INCLUDING SILICIDED AND NON-SILICIDED CIRCUIT ELEMENTS

BACKGROUND OF THE INVENTION

1. Field of the Invention

Generally, the present disclosure relates to the field of integrated circuits, and, in particular, to integrated circuits that include both circuit elements wherein a silicide is formed and circuit elements wherein no silicide is formed.

2. Description of the Related Art

Integrated circuits typically include a large number of circuit elements, which form an electric circuit. Circuit elements provided in integrated circuits can include active devices, such as, for example, field effect transistors and/or bipolar transistors. Additionally, integrated circuits can include passive devices, such as capacitors, inductivities and/or resistors.

In field effect transistors, a gate electrode as well as source, drain and channel regions formed in a semiconductor material are provided. The gate electrode may be separated from the channel region by a gate insulation layer providing electrical insulation between the gate electrode and the channel region. Adjacent the channel region, the source region and the drain region that are doped differently than the channel region are provided. Depending on an electric voltage applied to the gate electrode, the field effect transistor may be switched between an ON-state and an OFF-state, wherein an electric conductivity of the channel region in the ON-state is greater than an electric conductivity of the channel region in the OFF-state.

For increasing the conductivity of the channel region of a field effect transistor in the ON-state, it has been proposed to provide an elastic stress in the channel region. A tensile stress may increase the mobility of electrons in a semiconductor material such as silicon. Providing a tensile stress in the channel region of an N-channel transistor may help to improve the conductivity of the channel region, so that a greater current through the channel region in the ON-state of the transistor can be obtained. A compressive stress in a semiconductor material such as silicon may improve the mobility of holes, so that providing a compressive stress in the channel region of a P-channel transistor may help to obtain a greater current through the channel region of the P-channel transistor in the ON-state of the transistor.

Techniques for providing an elastic stress in the channel region of a field effect transistor include stress memorization techniques. The source and drain regions are amorphized by an ion implantation, and a layer of a dielectric material having an intrinsic stress, for example a layer of stressed silicon nitride, is deposited over the semiconductor structure wherein the transistor is provided. Then, an annealing process is performed in the presence of the dielectric layer. During the annealing process, the amorphized source and drain regions are re-crystallized, wherein a crystalline structure that is influenced by the stress provided by the dielectric layer is obtained. Distances between atoms in the re-crystallized source and drain regions of the transistor may deviate from the natural crystal lattice constant of the semiconductor material wherein the source and drain region are formed, so that an intrinsic elastic stress is obtained in the source region and the drain region. The intrinsic elastic stress of the source region and the drain region may be maintained at least partially after a removal of the stressed dielectric layer that may be performed in later processing steps.

Types of resistors that may be provided in integrated circuits include resistors that include an elongated line providing an electrical resistance, the elongated line being formed from one or more material layers that are deposited on a surface of a semiconductor structure from which the integrated circuit will be formed. For reducing the number of material layers that are deposited and/or patterned in the formation of an integrated circuit, it has been proposed to use material layers that are deposited for forming gate electrodes of field effect transistors also for forming resistors.

Gate electrodes of field effect transistors may include polysilicon. In addition to polysilicon, in transistors formed in accordance with the high-k metal gate technique, one or more metal layers may be provided in the gate electrode for adjusting the work function of the gate electrode.

For improving an electric conductivity of gate electrodes of field effect transistors, a silicide may be formed from the polysilicon of the gate electrodes. This may be done by depositing a metal layer over the semiconductor structure and then performing an annealing process to initiate a chemical reaction wherein a silicide is formed from the polysilicon and the metal.

A formation of silicide in elongated lines of resistors may be disadvantageous, in particular, if resistors having a relatively high resistance are to be provided, since, in contrast to gate electrodes of field effect transistors, in elongated lines of resistors, a high resistivity of the material of the elongated lines may be desirable.

Therefore, before depositing a metal layer that is employed for the formation of silicide in the gate electrodes of field effect transistors, a hardmask may be formed over the resistors. The hardmask can prevent a contact between the metal and the polysilicon of the elongated lines of the resistors, so that no silicide is formed in the elongated lines of the resistors.

An issue associated with the above-described techniques for forming field effect transistors and resistors in integrated circuits is that a relatively large number of processes of depositing and patterning material layers may be required, which can increase the complexity of and time required for the manufacturing process. Moreover, in etch processes used for patterning material layers, damages of features formed in earlier stages of the manufacturing process may occur.

The present disclosure provides methods wherein the above-mentioned issue may be avoided or at least reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

A method disclosed herein includes providing a semiconductor structure. The semiconductor structure includes at least one first circuit element including a first semiconductor material and at least one second circuit element including a second semiconductor material. A dielectric layer having an intrinsic stress is formed. The dielectric layer includes a first portion over the at least one first circuit element and a second portion over at least a portion of each of the at least one second circuit element. A first annealing process is performed. In the first annealing process, an intrinsic stress is created at least in the first semiconductor material by stress memorization. After the first annealing process, the first portion of the dielectric layer is removed. A layer of a metal is formed, and a second annealing process is performed. In the second annealing process, the metal and the first semiconductor material react chemically to form a silicide. The second portion of the dielectric layer substantially prevents a chemical reaction between the second semiconductor material and the metal in at least a portion of each of the at least one second circuit element.

BRIEF DESCRIPTION OF THE DRAWINGS

The disclosure may be understood by reference to the following description taken in conjunction with the accompanying drawings, in which like reference numerals identify like elements, and in which.

Figure 1:
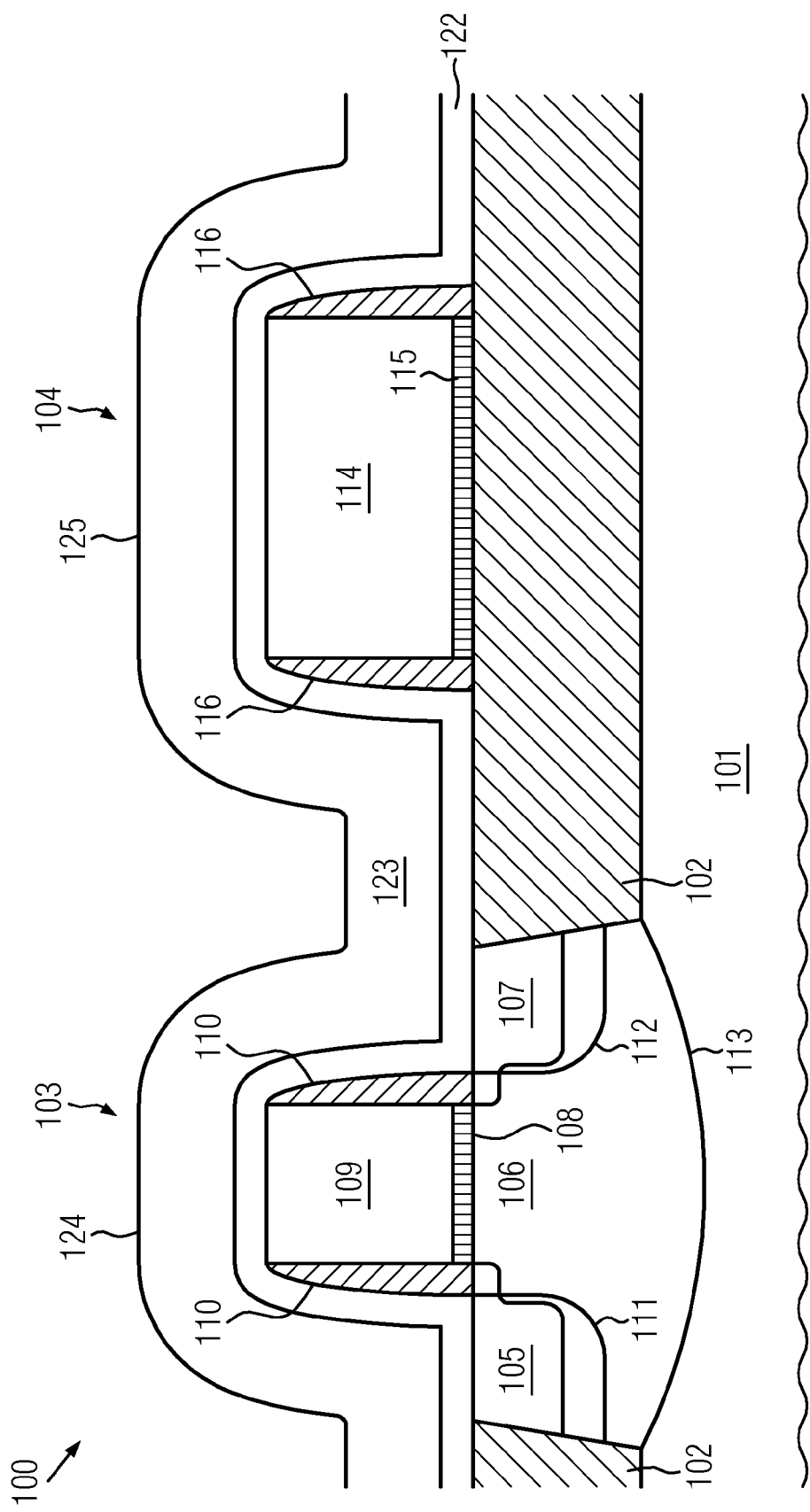
FIGS. 1-5 show schematic cross-sectional views of a semiconductor structure in stages of a manufacturing process according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

According to embodiments of the present disclosure, a stressed dielectric layer, for example, a stressed silicon nitride layer, that is employed in stress memorization techniques for providing an elastic stress in first circuit elements or portions thereof, for example in source, drain and/or channel regions of field effect transistors, is used also for preventing a formation of a silicide in second circuit elements, such as, for example, resistors. Thus, no separate hardmask needs to be formed for preventing a formation of silicide in the second circuit elements, and the number of process steps performed in the formation of an integrated circuit including the first and second circuit elements may be reduced. In particular, a number of steps of etching, cleaning and photoresist removal which might adversely affect features of the semiconductor structure, such as, for example, field oxide and gate insulation layers including a high-k material, may be reduced.

The present disclosure is not limited to embodiments wherein the first circuit element is a field effect transistor and the second circuit element is a resistor. In other embodiments, both circuit elements may be field effect transistors.

The second circuit elements may be provided in OP regions including a passive resistor module of the semiconductor structure. By not completely removing the stressed dielectric layer in the OP regions, the stress memorization effect may be further increased. In an anneal step of the stress memorization technique, wherein the stress provided by the stressed dielectric layer is transferred into portions of the first circuit elements and, optionally, second circuit elements, the stressed dielectric layer may be hardened, making it more robust. This may allow providing a decreased thickness of the stressed dielectric while still maintaining integrity.

FIG. 1 shows a schematic cross-sectional view of a semiconductor structure 100 in a stage of a manufacturing process according to an embodiment. The semiconductor structure 100 includes a substrate 101. The substrate 101 may include a semiconductor material such as, for example, silicon. In some embodiments, the substrate 101 may be a bulk semiconductor substrate, for example a silicon wafer or die. In other embodiments, the substrate 101 may be a semiconductor-on-insulator substrate including a layer of a semiconductor material, for example a silicon layer, that is provided above a support substrate, for example a silicon wafer, and separated therefrom by an electrically insulating layer, for example a silicon dioxide layer.

The semiconductor structure 100 additionally includes a field effect transistor 103 and a resistor 104. The field effect transistor 103 and the resistor 104 may be circuit elements of an integrated circuit that is formed from the semiconductor structure 100 in the manufacturing process. In addition to the field effect transistor 103 and the resistor 104, the semiconductor structure 100 may include other field effect transistors having features similar to those of field effect transistor 103, and other resistors having features similar to the resistor 104. For simplicity, in FIGS. 1-5, only one field effect transistor and one resistor are shown.

The integrated circuit formed from the semiconductor structure 100 may include a logic circuit and/or a static random access memory circuit (SRAM circuit). The field effect transistor 103 may be a circuit element of the logic circuit or a circuit element of the SRAM circuit. Additionally, the integrated circuit may include an OP region. The resistor 104 may be a circuit element provided in the OP region.

The semiconductor structure 100 may further include a trench isolation structure 102, which may be a shallow trench isolation structure including trenches formed in the substrate 101 that are filled with an electrically insulating material such as, for example, silicon dioxide. The trench isolation structure 102 may provide electrical insulation between the field effect transistor 103 and the resistor 104. Additionally, the trench isolation structure 102 may electrically insulate other circuit elements (not shown) from the field effect transistor 103 and the resistor 104.

The field effect transistor 103 may include an active region 113. The active region 113 may be doped in accordance with the type of the field effect transistor 103. In embodiments wherein the field effect transistor 103 is an N-channel transistor, the active region 113 may be P-doped. In embodiments wherein the field effect transistor 103 is a P-channel transistor, the active region 113 may be N-doped. In the active region 113, a source region 105, a channel region 106 and a drain region 107 may be provided. The source region 105 and the drain region 107 may be doped opposite to the basic doping of the active region 113, i.e., N-doped in the case of an N-channel transistor and P-doped in the case of a P-channel transistor. The doping of the channel region 106 may correspond to the basic doping of the active region 113.

The field effect transistor 103 further includes a gate electrode 109 that is provided above the channel region 106 and separated therefrom by a gate insulation layer 108. In some embodiments, the gate insulation layer 108 may be formed of silicon dioxide, and the gate electrode 109 may be formed of polysilicon. In other embodiments, the gate insulation layer 108, or at least portions thereof, may be formed of a high-k dielectric material having a dielectric constant greater than silicon dioxide, for example, hafnium oxide and/or zirconium oxide. In such embodiments, the gate electrode 109 may include a layer of a metal (not shown) formed on the gate insulation layer 108 for adapting the work function of the gate electrode 109.

The metal may be selected in accordance with the type of the field effect transistor 103. In embodiments wherein the field effect transistor 103 is an N-channel transistor, the metal may include lanthanum, lanthanum nitride and/or titanium nitride. In embodiments wherein the field effect transistor 103 is a P-channel transistor, the metal may include aluminum and/or aluminum nitride. In addition to the layer of metal provided on the gate insulation layer 108, the gate electrode 109 may include a layer of polysilicon provided on the layer of metal. Thus, both in embodiments wherein the gate insulation layer 108 is formed of silicon dioxide and in embodiments wherein the gate insulation layer 108 includes a high-k material, polysilicon may be provided at a top side of the gate electrode 109 located opposite a bottom side contacting the gate insulation layer 108.

At sidewalls of the gate electrode 109, a sidewall spacer 110 may be provided. The sidewall spacer 110 may be formed of an electrically insulating material, such as, for example, silicon nitride, silicon oxynitride and/or silicon dioxide.

The field effect transistor 103 may further include amorphized regions 111, 112 that are provided adjacent the gate electrode 109. The amorphized regions 111, 112 may overlap with the source region 105 and the drain region 107, so that at least portions of the source region 105 and the drain region 107 include amorphous semiconductor material.

The resistor 104 may include an electrically insulating layer 115 and an elongated line 114. The layer 115 of electrically insulating material may have a composition corresponding to that of the gate insulation layer 108, and the elongated line 114 may have a composition corresponding to that of the gate electrode 109.

In some embodiments, the electrically insulating layer 115 and the elongated line 114 may be provided above a portion of the trench isolation structure 102. In other embodiments, the electrically insulating layer 115 and the elongated line 114 may be provided above a semiconductor region, which may be provided by a portion of the substrate 101. At sidewalls of the elongated line 114, a sidewall spacer 116 may be provided. Features of the sidewall spacer 116 of the resistor 104 may correspond to those of the sidewall spacer 110 of the field effect transistor 103.

The gate electrode 109 of the field effect transistor 103 and the elongated line 114 of the resistor 104 may have corresponding compositions. Hence, at a top side of the elongated line 114 that is located opposite a bottom side contacting the electrically insulating layer 115, polysilicon may be provided. In some embodiments, substantially the entire elongated line 114 may be formed of polysilicon. In other embodiments, the elongated line 114 may include a metal layer at the bottom side of the elongated line 114, wherein the metal layer is formed on the electrically insulating layer 115 and wherein the elongated line 114 additionally includes a polysilicon portion at the top side of the elongated line 114.

The electrically insulating layer 115 of the resistor 104 may have a composition corresponding to that of the gate insulation layer 108 of the field effect transistor 103. Hence, in some embodiments, the electrically insulating layer 115 may be formed of silicon dioxide. In other embodiments, the electrically insulating layer 115 may at least partially be formed of a high-k material.

Each of the field effect transistor 103 and the resistor 104 may include a semiconductor material, wherein the semiconductor material of the field effect transistor 103 as well as the semiconductor material of the resistor 104 may include silicon. The semiconductor materials of the field effect transistor 103 and the resistor 104 may be provided in amorphous, polycrystalline and/or crystalline form. In the stage of the manufacturing process shown in FIG. 1, amorphous semiconductor material, for example amorphous silicon, may be provided in the source region 105 and the drain region 107 of the field effect transistor 103. Polycrystalline semiconductor material, for example polysilicon, may be provided in the gate electrode 109 of the field effect transistor 103 and the elongated line 114 of the resistor 104. As will be described below with reference to FIG. 2, in later stages of the manufacturing process, the amorphous regions 111, 112 may be re-crystallized, so that crystalline semiconductor material is obtained in the source region 105 and the drain region 107.

Herein, the semiconductor material of the field effect transistor 103 and the semiconductor material of the resistor 104 will sometimes be denoted as "first semiconductor material" and "second semiconductor material," respectively, wherein the denotations "first" and "second" are used to denote locations of the respective semiconductor materials in the field effect transistor 103 and the resistor 104, respectively, and do not imply that the first and the second semiconductor material have a different composition.

The first semiconductor material may, thus, include, in particular, semiconductor material in the source region 105, the drain region 107 and the gate electrode 109 of the field effect transistor 103. The second semiconductor material may include, in particular, semiconductor material in the elongated line 114.

The above-described features of the semiconductor structure 100 may be formed as follows.

The trench isolation structure 102 may be formed by means of techniques of forming shallow trench isolation structures, which may include processes of photolithography and etching for forming trenches in the semiconductor material of the substrate 101, and processes of oxidation, deposition and/or chemical mechanical polishing for filling the trenches with an electrically insulating material such as silicon.

The active region 113 of the field effect transistor 103 may be formed by means of an ion implantation process wherein ions of a dopant are implanted into the semiconductor material of the substrate 101. During this ion implantation process, portions of the semiconductor structure 100 wherein the resistor 104 is to be formed may be covered by a mask, for example, a photoresist mask (not shown).

Thereafter, the gate insulation layer 108, the electrically insulating layer 115, the gate electrode 109 and the elongated line 114 may be formed. For this purpose, one or more material layers including materials from which the gate insulation layer 108 and the electrically insulating layer 115 are to be formed, and one or more layers of the materials from which the gate electrode 109 and the elongated line 114 are to be formed may be deposited over the substrate 101. A topmost one of the material layers from which the gate electrode 109 and the elongated line 114 are to be formed may include polysilicon.

For depositing the layers of the materials of the gate insulation layer 108, the electrically insulating layer 115, the gate electrode 109 and the elongated line 114, deposition techniques such as chemical vapor deposition, plasma enhanced chemical vapor deposition, atomic layer deposition, plasma enhanced atomic layer deposition and/or physical vapor deposition may be employed.

Thereafter, the deposited material layers may be patterned for forming the gate insulation layer 108, the gate electrode 109, the electrically insulating layer 115 and the elongated line 114, for example, by means of techniques of photolithography and etching.

Thereafter, an ion implantation process may be performed for forming a source extension of the source region 105 and a drain extension of the drain region 107 (shown in FIG. 1 as relatively shallow portions of the source region 105 and the drain region 107 extending below the sidewall spacer 110). In this ion implantation process, portions of the semiconductor structure wherein the resistor 104 is formed may be covered by a mask, for example, a photoresist mask, for avoiding an introduction of dopants into the elongated line 114.

Then, the sidewall spacers 110, 116 of the field effect transistor 103 and the resistor 104 may be formed. This may be done by substantially isotropically depositing a layer of a sidewall spacer material from which the sidewall spacers 110, 116 are to be formed, for example a layer of silicon nitride, over the semiconductor structure 100. The layer of sidewall spacer material may be deposited by means of deposition techniques such as chemical vapor deposition, plasma enhanced chemical vapor deposition and/or atomic layer deposition. Thereafter, an anisotropic etch process, for example a reactive ion etch process, may be performed for removing portions of the layer of sidewall spacer material over portions of the semiconductor structure 100 having a substantially horizontal surface such as, for example, the source region 105, the drain region 107, the trench isolation structure 102 and top surfaces of the gate electrode 109 and the elongated line 114. Due to the anisotropy of the etch process, portions of the layer of sidewall spacer material at the sidewalls of the gate electrode 109 and the elongated line 114 may remain in the semiconductor structure 100 and form the sidewall spacers 110, 116.

Thereafter, an ion implantation process wherein ions of a dopant material are introduced into the semiconductor structure 100 may be performed for forming the source region 105 and the drain region 107. In this ion implantation process, the resistor 104 may be covered by a mask, for example a photoresist mask, to avoid a doping of the elongated line 114.

Additionally, an ion implantation process wherein the semiconductor structure 100 is irradiated with ions of a non-doping substance may be performed for forming the amorphized regions 111, 112 of the field effect transistor 103. In some embodiments, the formation of the amorphized regions 111, 112 may be performed after the formation of the sidewall spacers 110, 116 and/or after the formation of the source region 105 and the drain region 107. Thus, ions of the non-doping substance may be absorbed by the sidewall spacers 110, 116, so that the amorphized regions 111, 112 are spaced apart from the gate electrode. In some embodiments, the formation of the amorphized regions 111, 112 may be performed after the formation of the sidewall spacers 110, 116, but before the formation of the source region 105 and the drain region 107.

In other embodiments, the amorphized regions 111, 112 may be formed before the formation of the sidewall spacers 110, 116. In such embodiments, there is no absorption of ions of the non-doping substance by the sidewall spacers 110, 116, so that the amorphized regions 111, 112 of the field effect transistor 103 may be provided closer to the gate electrode 109.

The ions of the non-doping substance employed for the formation of the amorphized regions 111, 112 may include ions of a noble gas, for example, ions of helium, neon, argon, krypton and/or xenon. Alternatively or additionally, the ions of the non-doping substance may include ions of an element from the carbon group of the periodic table of elements, for example, ions of carbon, silicon and/or germanium.

Due to the implantation of the ions of the non-doping substance, the crystalline order of the semiconductor material of the substrate 101 may be destroyed in the amorphized regions 111, 112 so that substantially amorphous semiconductor material is obtained.

After the formation of the features of the field effect transistor 103 and the resistor 104 described above, an etch stop layer 122 and a stressed dielectric layer 123 may be deposited over the semiconductor structure 100. The etch stop layer 122 and the stressed dielectric layer 123 may be formed from different materials, wherein the material of the stressed dielectric layer 123 may be etched selectively with respect to the material of the etch stop layer 122. In some embodiments, the stressed dielectric layer 123 may include silicon nitride, and the etch stop layer 122 may include silicon dioxide. The stressed dielectric layer 123 includes a portion 124 over the field effect transistor 103 and a portion 125 over the resistor 104.

The etch stop layer 122 and the stressed dielectric layer 123 may be formed by means of deposition techniques such as, for example, chemical vapor deposition, plasma enhanced chemical vapor deposition, atomic layer deposition and/or plasma enhanced atomic layer deposition.

The stressed dielectric layer 123 may have an intrinsic stress. In embodiments wherein the field effect transistor 103 is an N-channel transistor, the stressed dielectric layer 123 may have an intrinsic tensile stress. In embodiments wherein the field effect transistor 103 is a P-channel transistor, the stressed dielectric layer 123 may have an intrinsic compressive stress. The intrinsic stress of the stressed dielectric layer 123 may be controlled by varying parameters of a deposition process employed for the formation of the stressed dielectric layer 123. Parameters of deposition processes that may be used for providing a desired intrinsic stress of the stressed dielectric layer 123 as described above may correspond to those of conventional processes for forming stressed dielectric layers that are employed in the stress memorization technique for providing stressed channel regions of field effect transistors.

Figure 2:
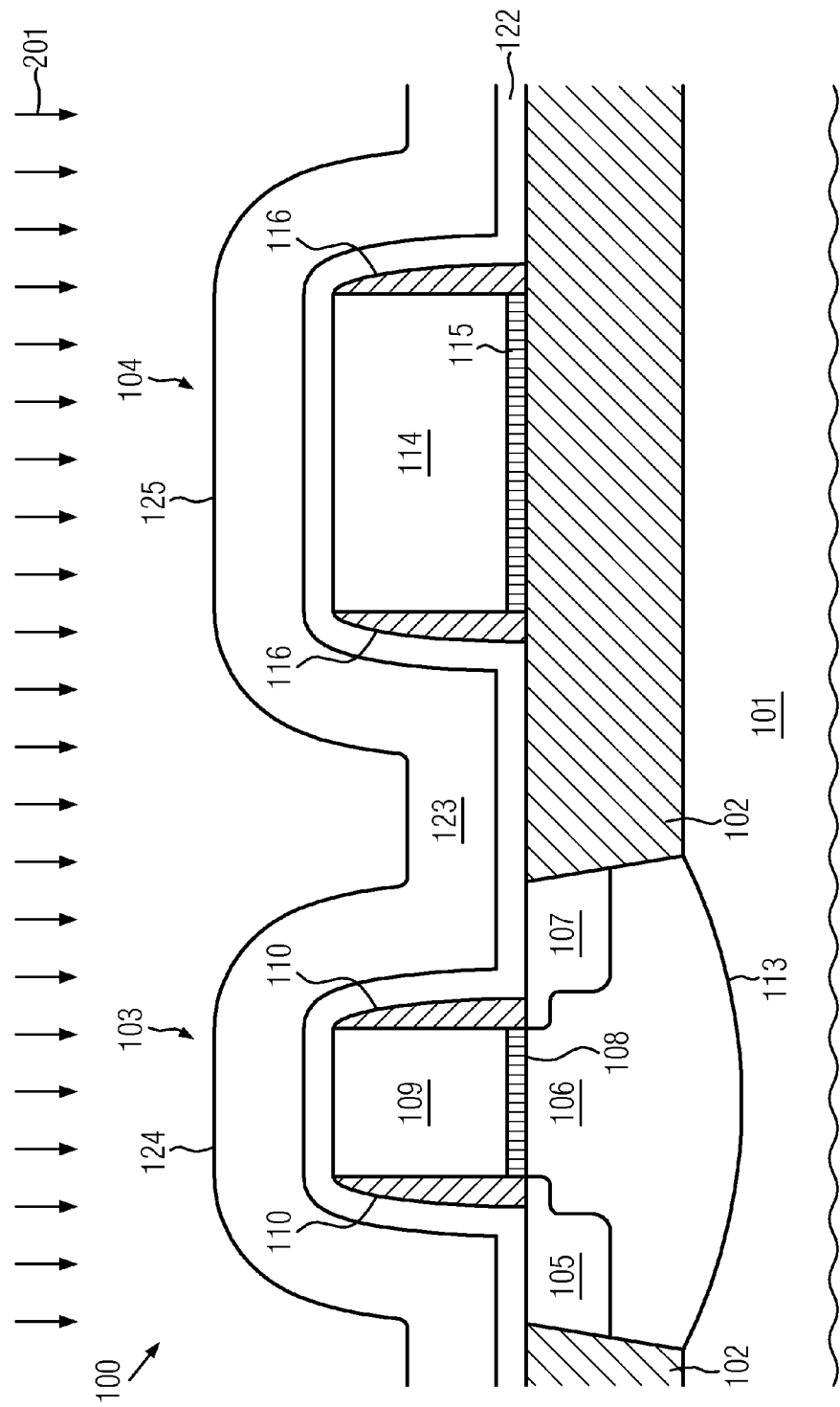

FIG. 2 shows a schematic cross-sectional view of the semiconductor structure 100 in a later stage of the manufacturing process. After the formation of the stressed dielectric layer 123, an annealing process may be performed, as schematically denoted by arrows 201 in FIG. 2. The annealing process 201 may be a rapid thermal annealing process, wherein the semiconductor structure 100 is exposed to a relatively high temperature for a relatively short amount of time. In the rapid thermal annealing process, the semiconductor structure 100 may be irradiated with electromagnetic radiation, for example, visible, infrared and/or ultraviolet light. The electromagnetic radiation may be created by means of one or more lamps and/or one or more lasers.

Alternatively, the annealing process 201 may be a furnace annealing process, wherein the semiconductor structure 100 is inserted into a furnace that is maintained at an elevated temperature.

The annealing process 201 may induce a re-crystallization of the amorphized semiconductor material in the amorphized regions 111, 112 (see FIG. 1). In the re-crystallization, the atoms of the semiconductor material in the amorphized regions 111, 112 may rearrange into a crystalline order. The stressed dielectric layer 123 above the amorphized regions 111, 112 may provide an elastic stress in the amorphized regions 111, 112 which is present, in particular, during the re-crystallization of the amorphized regions 111, 112.

The crystalline order obtained in the re-crystallization of the amorphized regions 111, 112 may be influenced by the intrinsic stress provided by the stressed dielectric layer 123. In particular, distances between atoms of the re-crystallized semiconductor material may differ from the natural crystal lattice constant of the semiconductor material, so that the re-crystallized semiconductor material has an intrinsic stress. The intrinsic stress of the re-crystallized semiconductor material may be maintained independently of the presence of the stressed dielectric layer 123 over the re-crystallized semiconductor material, so that the intrinsic stress of the re-crystallized semiconductor material may be maintained after a removal of the stressed dielectric layer 123 or portions thereof. This effect is denoted as "stress memorization."

Due to the stress memorization, an intrinsic stress may be obtained in the first semiconductor material of the field effect transistor 103, in particular in the source region 105 and the drain region 107.

The intrinsic stress of the source region 105 and the drain region 107 may have an influence on the channel region 106 of the field effect transistor 103, so that the channel region 106 may be stressed. This may have an influence on the mobility of charge carriers in the channel region 106. The stress obtained in the channel region 106 may depend on the intrinsic stress of the stressed dielectric layer 123. In embodiments wherein the field effect transistor 103 is an N-channel transistor and the stressed dielectric layer 123 has an intrinsic tensile stress, a tensile stress improving the mobility of electrons may be obtained in the channel region 106. In embodiments wherein the field effect transistor 103 is a P-channel transistor and the stressed dielectric layer 123 has an intrinsic compressive stress, a compressive stress may be obtained in the channel region 106, which may improve the mobility of holes.

Figure 3:
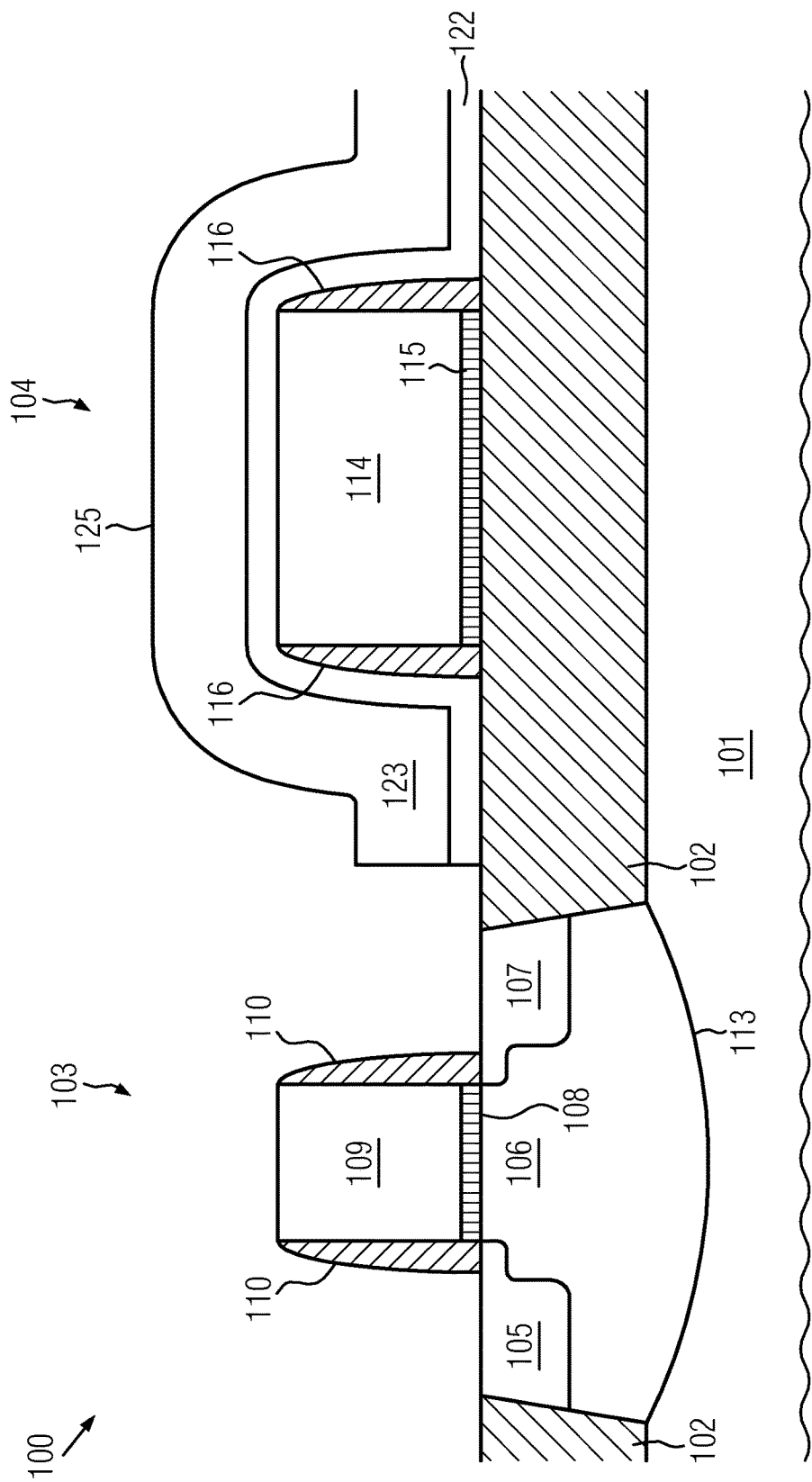

FIG. 3 shows a schematic cross-sectional view of the semiconductor structure 100 in a later stage of the manufacturing process. After the annealing process 201, the portion 124 of the stressed dielectric layer 123 over the field effect transistor 103 may be removed. Additionally, a portion of the etch stop layer 122 over the field effect transistor 103 may be removed. This may be done by means of processes of photolithography and etching.

Thus, portions of the field effect transistor 103, in particular the source region 105, the drain region 107 and the gate electrode 109 comprising the first semiconductor material are exposed at the surface of the semiconductor structure 100. The portion 125 of the stressed dielectric layer 123 over the resistor 104 is not removed and may remain in the semiconductor structure 100. Therefore, the portion 125 of the stressed dielectric layer 123 and the portion of the etch stop layer 122 below the portion 125 of the stressed dielectric layer 123 cover the resistor 104, in particular the second semiconductor material of the resistor 104 in the elongated line 114.

Figure 4:
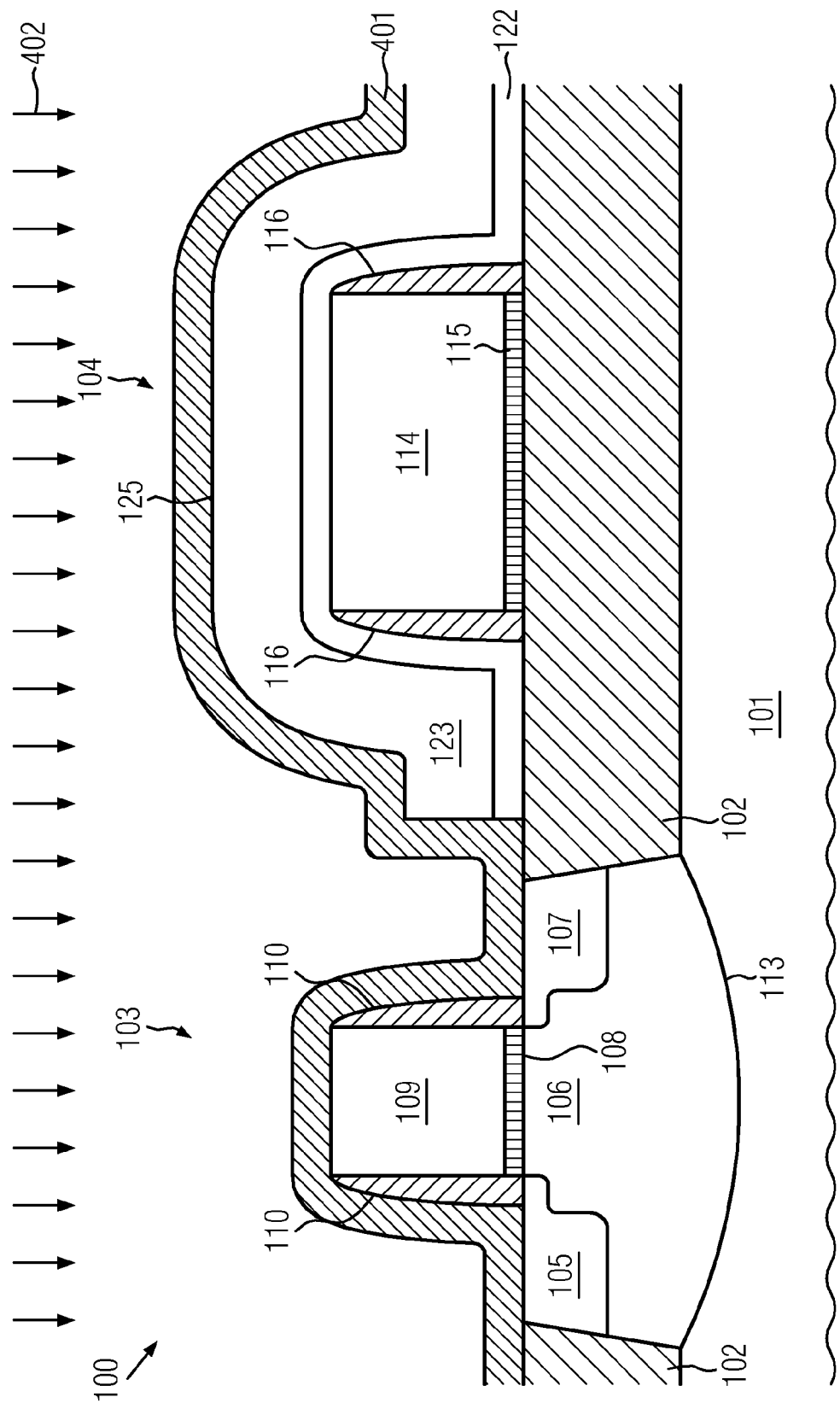

FIG. 4 shows a schematic cross-sectional view of the semiconductor structure 100 in a later stage of the manufacturing process. After the removal of the portion 124 of the stressed dielectric layer 123 over the field effect transistor 103, a metal layer 401 may be deposited over the semiconductor structure 100. This may be done by means of techniques of physical vapor deposition such as, for example, sputtering.

The metal layer 401 may include a refractory metal. In some embodiments, the metal layer 401 may include nickel. In other embodiments, the metal layer 401 may include a refractory metal other than nickel, for example, titanium or cobalt. In further embodiments, the metal layer 401 may include an alloy of two or more refractory metals.

The metal layer 401 may contact the first semiconductor material of the field effect transistor 103 that is exposed at the surfaces of the source region 105, the drain region 107 and the gate electrode 109. In the area of the resistor 104, the metal layer 401 is provided on the portion 125 of the stressed dielectric layer 123 over the resistor 104. Thus, the portion 125 of the stressed dielectric layer 123 is arranged between the second semiconductor material in the resistor 104 and the metal of the metal layer 401, and prevents a contact between the metal and the second semiconductor material.

After the formation of the metal layer 401, an annealing process may be performed, as schematically denoted by arrows 402 in FIG. 4. The annealing process 402 may be a rapid thermal annealing process as described above with reference to FIG. 2.

Figure 5:
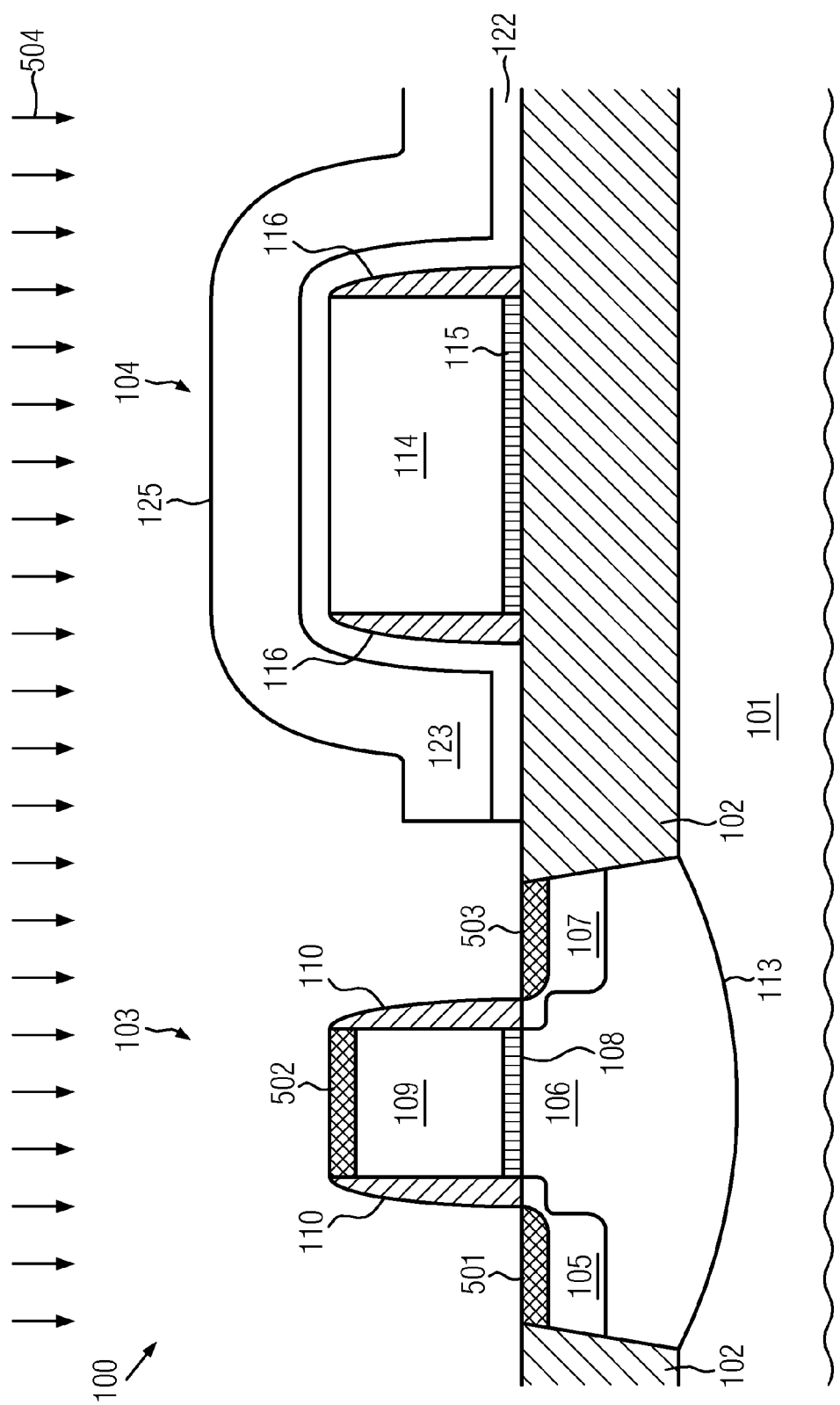

FIG. 5 shows a schematic cross-sectional view of the semiconductor structure 100 in a later stage of the manufacturing process. The annealing process 402 (FIG. 4) may initiate a chemical reaction between the metal of the metal layer 401 and the first semiconductor material in the field effect transistor 103. In particular, the metal may react with the semiconductor material of the source region 105 and the drain region 107, and with the semiconductor material of the gate electrode 109. Thus, a silicide region 501 may be formed in the source region 105, a silicide region 503 may be formed in the drain region 107 and a silicide region 502 may be formed in the gate electrode 109.

Since the portion 125 of the stressed dielectric layer 123 is provided above the resistor 104 and is arranged between the metal layer 401 and the resistor 104, the portion 125 of the stressed dielectric layer 123 may substantially prevent a chemical reaction between the metal of the metal layer 401 and the second semiconductor material in the elongated line 114 of the resistor 104. Accordingly, a formation of silicide in the resistor 104 may be substantially avoided.

After the annealing process 402, unreacted metal from the metal layer 401 may be removed. This may be done by means of a wet etch process wherein the semiconductor structure 100 is exposed to an etchant adapted to remove the metal of the metal layer 401. In embodiments wherein the metal layer 401 includes nickel, the etchant may include a mixture of hydrochloric acid, hydrogen peroxide and deionized water or a mixture of sulfuric acid, hydrogen peroxide and water.

Thereafter, a further annealing process may be performed, as schematically denoted by arrows 504 in FIG. 5. Similar to the annealing process 402 described above with reference to FIG. 4, the annealing process 504 may be a rapid thermal annealing process. In the annealing process 504, the silicide in the silicide regions 501, 502, 503 may be converted into a more stable phase, which may also have a lower electric resistivity.

Thereafter, processes for completing the formation of an integrated circuit from the semiconductor structure 100 may be performed. These processes may include the deposition of an interlayer dielectric over the semiconductor structure 100, and the formation of contacts providing electrical connections to the source region 105, the drain region 107 and the gate electrode 109 of the field effect transistor 103. Additionally, contacts providing electrical connections to opposite ends of the elongated line 114 of the resistor 104 may be formed, and back end of line processes may be performed.

As described above, the portion 125 of the stressed dielectric layer 123 over the resistor 104 may be used for preventing a formation of silicide in the resistor 104. Thus, different from conventional techniques, no separate hardmask is needed for preventing the formation of silicide in the resistor 104. Thus, a number of processes of deposition and etching may be reduced. Furthermore, an undesired removal of materials from the semiconductor structure 100, for example materials of the trench isolation structure 102 and the sidewall spacers 110, 116 and/or the gate insulation layer 108 and the electrically insulating layer 115, may be substantially avoided or at least reduced.

The present disclosure is not limited to embodiments wherein a first circuit element wherein a silicide is formed is a field effect transistor, and a second circuit element wherein no silicide is formed is a resistor, as described above. In other embodiments, both the first circuit element and the second circuit element may be field effect transistors. Thus, an integrated circuit comprising both transistors having silicide regions and transistors without silicide regions may be formed. In the following, such embodiments will be described with reference to FIG. 6.

Figure 6:
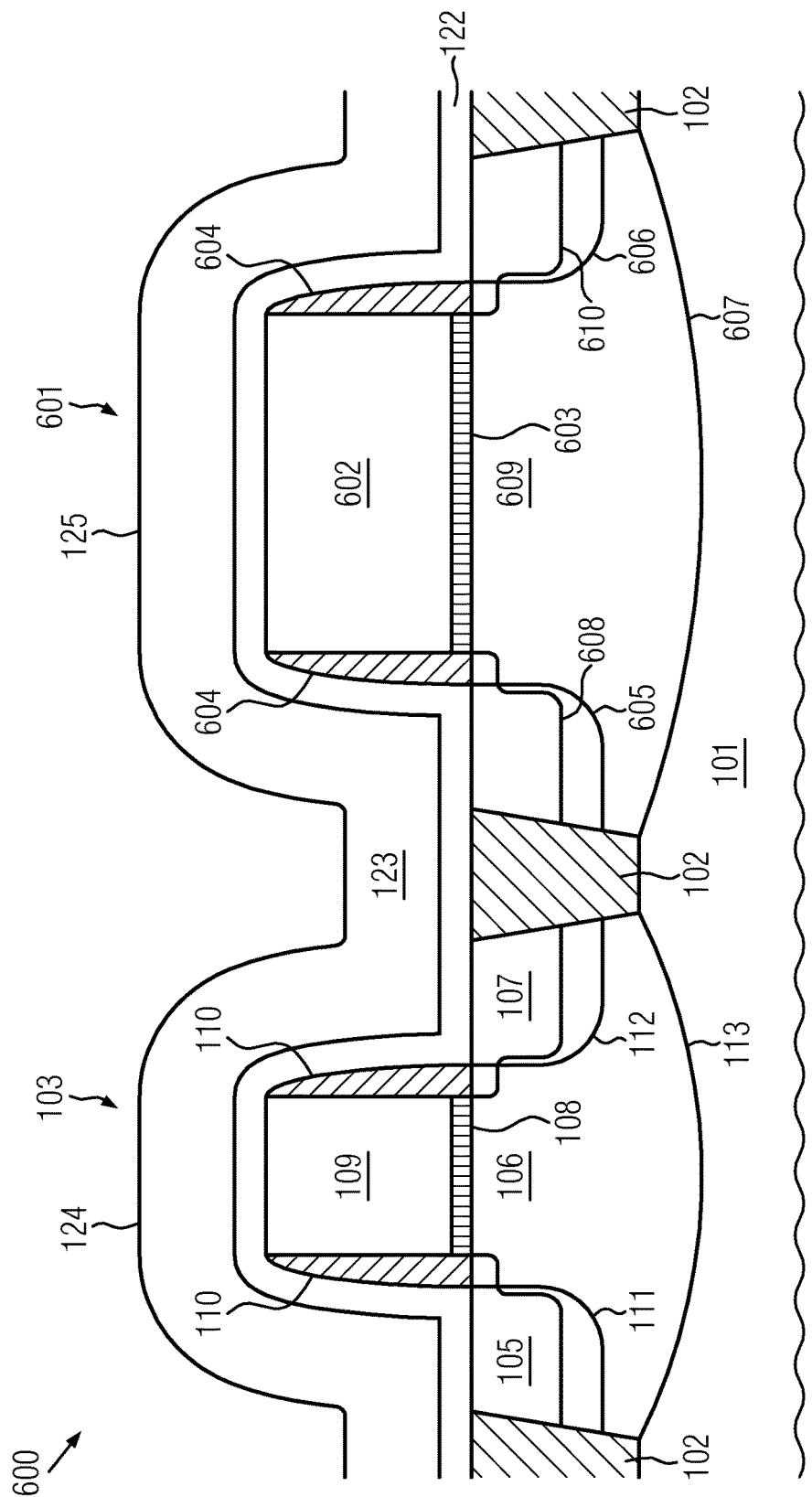
FIG. 6 shows a schematic cross-sectional view of a semiconductor structure in a stage of a manufacturing process according to an embodiment.

FIG. 6 shows a schematic cross-sectional view of a semiconductor structure 600 in a stage of a manufacturing process according to an embodiment. For convenience, in FIGS. 1-5, on the one hand, and in FIG. 6, on the other hand, like reference numerals have been used to denote like components. Unless explicitly stated otherwise, features of components shown in FIG. 6 may correspond to those of components shown in FIGS. 1-5 denoted by like reference numerals, and corresponding techniques may be employed for their formation.

The semiconductor structure 600 includes a substrate 101, a first field effect transistor 103 and a second field effect transistor 601.

The first field effect transistor 103 includes an active region 113, a source region 105, a channel region 106, a drain region 107, a gate insulation layer 108 and a gate electrode 109. Adjacent the gate electrode 109, a sidewall spacer 110 is provided. In the active region 113, amorphized regions 111, 112 overlapping with the source region 105 and the drain region 107 may be formed.

The second field effect transistor 601 includes an active region 607. The active region 607 may be doped in accordance with the type of the second field effect transistor 601. In embodiments wherein the second field effect transistor 601 is an N-channel transistor, the active region may be P-doped. In embodiments wherein the second field effect transistor 601 is a P-channel transistor, the active region 607 may be N-doped.

Above the active region 607, a gate insulation layer 603 and a gate electrode 602 of the second field effect transistor 601 are provided. The gate insulation layer 603 of the second field effect transistor 601 and the gate insulation layer 108 of the first field effect transistor 103 may have corresponding compositions. In some embodiments, the gate insulation layers 108, 603 may include silicon dioxide. In other embodiments, the gate insulation layers 108, 603 may at least partially be formed of a high-k material having a greater dielectric constant than silicon dioxide.

The gate electrode 109 of the first field effect transistor 103 and the gate electrode 602 of the second field effect transistor 601 may have corresponding compositions. In some embodiments, the gate electrodes 109, 602 may be substantially completely formed of polysilicon. In other embodiments, portions of the gate electrodes 109, 602 at bottom sides thereof which are provided directly on the gate insulation layer 108 and the gate insulation layer 603, respectively, may be formed of a metal, and portions of the gate electrodes 109, 602 at top sides thereof may be formed of polysilicon.

The second field effect transistor 601 includes a source region 608 and a drain region 610 that are doped oppositely to the doping of the active region 607, and a channel region 609 below the gate electrode 602 having a doping substantially corresponding to the base doping of the active region 607. At sidewalls of the gate electrode 602, a sidewall spacer 604 may be provided.

Additionally, the second field effect transistor 601 may include amorphized regions 605, 606 overlapping with the source region 608 and the drain region 610, respectively.

The semiconductor structure 600 may further include a trench isolation structure 102 providing electrical insulation between the field effect transistors 103, 601, and between the field effect transistors 103, 601 and other circuit elements in the semiconductor structure 600.

A gate length of the second field effect transistor 601, being an extension of the gate electrode 602 between the source region 608 and the drain region 610 that defines a channel length of the second field effect transistor 601 may be greater than a gate length of the first field effect transistor 103, being an extension of the gate electrode 109 between the source region 105 and the drain region 107 that defines a channel length of the first field effect transistor 103.

The first field effect transistor 103 includes a first semiconductor material provided in the source region 105, the drain region 107 and the gate electrode 109. The second field effect transistor 601 includes a second semiconductor material provided in the source region 608, the drain region 610 and the gate electrode 602.

Similar to the embodiments described above with reference to FIGS. 1-5, the terms "first semiconductor material" and "second semiconductor material" are used to denote the location of the respective semiconductor material in a first circuit element (the first field effect transistor 103) and a second circuit element (the second field effect transistor 601), respectively, and do not imply that the first semiconductor material and the second semiconductor material need to have a different composition.

Generally, for forming the above-described features of the semiconductor structure 600, techniques similar to those described above with reference to FIG. 1 may be employed. The active regions 113, 607 may be formed by means of one or more ion implantation processes wherein dopants are introduced into the semiconductor structure 600. The gate insulation layers 108, 603 and the gate electrodes 109, 602 may be formed from one or more material layers having a composition corresponding to that of the gate insulations layers 108, 603 and the gate electrodes 109, 602, wherein at least a topmost one of the material layers includes polysilicon, using processes of photolithography and etching. The sidewall spacers 110, 604 may be formed by an isotropic deposition and an anisotropic etching of a layer of a sidewall spacer material. The source regions 105, 608 and the drain regions 107, 610 may be formed by ion implantation, wherein source and drain extensions may be formed by a first ion implantation before the formation of the sidewall spacers 110, 604, and the rest of the source regions 105, 608 and the drain regions 107, 610 may be formed by a second ion implantation after the formation of the sidewall spacers 110, 604. The amorphized regions 111, 112, 605, 606 may be formed by irradiating the semiconductor structure 600 with ions of a non-doping substance.

After the formation of the above-described features of the semiconductor structure 600, an etch stop layer 122 and a stressed dielectric layer 123 may be formed over the semiconductor structure 600. The stressed dielectric layer 123 includes a portion 124 over the first field effect transistor 103 and a portion 125 over the second field effect transistor 601. The stressed dielectric layer 123 has an intrinsic stress, and may be formed of silicon nitride, as described above with reference to FIG. 1.

Thereafter, an annealing process similar to the annealing process 201 described above with reference to FIG. 2 may be performed. In the annealing process, the amorphous semiconductor material in the amorphized regions 111, 112, 605, 606 may re-crystallize. Due to the influence of the stress provided by the stressed dielectric layer 123, in the re-crystallization of the amorphized regions 111, 112, 605, 606, an intrinsic stress may be created in the first semiconductor material in the source region 105 and the drain region 107 of the first field effect transistor 103 and in the second semiconductor material in the source region 608 and the drain region 610 of the second field effect transistor 601. The intrinsic stress in the source region 105 and the drain region 107 may create a stress in the channel region 106 of the first field effect transistor 103, and the intrinsic stress in the source region 608 and the drain region 610 may create a stress in the channel region 609 of the second field effect transistor 601.

Thereafter, the portion 124 of the stressed dielectric layer 123 over the first field effect transistor 103 may be removed by means of techniques of photolithography and etching, whereas the portion 125 over the second field effect transistor 601 remains in the semiconductor structure 600, and a metal layer similar to the metal layer 401 described above with reference to FIG. 4 may be deposited over the semiconductor structure 600.

Then, an annealing process similar to the annealing process 402 described above with reference to FIG. 4 may be performed. The annealing process may induce a chemical reaction between the metal of the metal layer and the first semiconductor material in the source region 105, the drain region 107 and the gate electrode 109 of the first transistor element 103, so that silicide regions are formed therein. The second semiconductor material in the source region 608, the drain region 610 and the gate electrode 602 of the second field effect transistor 601 is separated from the metal layer by the portion 125 of the stressed dielectric layer 123 over the second field effect transistor 601, so that substantially no silicide is formed in the second semiconductor material.

Thereafter, unreacted metal from the metal layer may be removed, for example, by means of a wet etch process as described above, and a further annealing process similar to the annealing process 504 described above with reference to FIG. 5 may be performed.

Further processing steps may include a formation of contacts providing electrical connections to the source regions 105, 608, the drain regions 107, 610 and the gate electrodes 109, 602 of the field effect transistors 103, 601, and back end of line processes for completing the formation of an integrated circuit from the semiconductor structure 600.

The present disclosure is not limited to embodiments wherein the second portion 125 of the stressed dielectric layer 123 over the resistor 104 or the second field effect transistor 601, respectively, covers the entire resistor 104 or second field effect transistor 601, respectively, during the formation of the silicide, as described above. In other embodiments, after the annealing process 201 that is performed for creating an intrinsic stress in the first semiconductor material and, optionally, in the second semiconductor material, a greater portion of the stressed dielectric layer 123 may be removed, so that the second portion 125 of the stressed dielectric layer 123 remaining in the semiconductor structure 100 covers only a part of the resistor 104 or the second field effect transistor 601, respectively. Thus, a silicide may be formed in portions of the resistor 104 or the second field effect transistor 601, respectively, and a formation of silicide in those portions which are covered by the second portion 125 of the stressed dielectric layer 123 may be substantially prevented.

For example, in embodiments similar to those described above with reference to FIGS. 1-5, a silicide may be formed at the ends of the elongated line 114, whereas a central portion of the elongated line 114 may be covered by the second portion 125 of the stressed dielectric layer 123, so that substantially no silicide is formed therein. The silicide at the end of the elongated line 114 may help to reduce contact resistances between contacts to the elongated line 114 provided at the ends of the elongated line 114 and the semiconductor material in the elongated line 114, whereas the portion at the center of the elongated line 114 wherein no silicide is formed may help to provide a high resistance of the resistor 114.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a semiconductor structure comprising at least one first circuit element comprising a first semiconductor material and at least one second circuit element comprising a second semiconductor material, wherein said at least one first circuit element comprises one or more first field effect transistors, each of said one or more first field effect transistors comprising a gate electrode and a sidewall spacer formed adjacent to sidewalls of said gate electrode;
   performing an ion implantation process to implant dopant ions into a source region and a drain region of said one or more first field effect transistors in the presence of said sidewall spacer, wherein an entire outer sidewall surface of said sidewall spacer is directly exposed to said ion implantation process;
   forming a dielectric layer having an intrinsic stress, said dielectric layer comprising a first portion over said at least one first circuit element and a second portion over at least a portion of each of said at least one second circuit element, wherein said first portion of said dielectric layer covers said entire outer sidewall surface of said sidewall spacer that was exposed to said ion implantation process;
   performing a first annealing process, wherein an intrinsic stress is created at least in said first semiconductor material by stress memorization; and
   after said first annealing process, removing said first portion of said dielectric layer, forming a layer of a metal and performing a second annealing process wherein said metal and said first semiconductor material react chemically to form a silicide, said second portion of said dielectric layer substantially preventing a chemical reaction between said second semiconductor material and said metal in at least a portion of each of said at least one second circuit element.

2. The method of claim 1, wherein at least said source region and said drain region comprise said first semiconductor material, and wherein, in said first annealing process, a first stressed region is formed in said source region and a second stressed region is formed in said drain region.

3. The method of claim 2, wherein said semiconductor structure comprises at least one of a logic circuit and a static random access memory circuit, and wherein said one or more first field effect transistors are provided in at least one of said logic circuit and said static random access memory circuit.

4. The method of claim 1, wherein said silicide is formed at least in said source region and in said drain region of each of said one or more first field effect transistors.

5. The method of claim 4, wherein said gate electrode of each of said one or more first field effect transistors comprises said first semiconductor material and said silicide is formed in said gate electrode of each of said one or more first field effect transistors.

6. The method of claim 1, wherein said dielectric layer comprises stressed silicon nitride.

7. The method of claim 6, further comprising forming an etch stop layer comprising silicon dioxide before the formation of said dielectric layer.

8. The method of claim 1, wherein said first semiconductor material comprises at least one amorphous region, said at least one amorphous region being re-crystallized in said first annealing process, the intrinsic stress being created in the re-crystallized amorphous region.

9. The method of claim 1, wherein said layer of metal comprises nickel.

10. The method of claim 1, wherein each of said first and said second semiconductor material comprises at least one of crystalline silicon, polycrystalline silicon and amorphous silicon.

11. The method of claim 1, further comprising:
    after said second annealing process, removing portions of said layer of metal that have not reacted chemically with said first semiconductor material, and, thereafter, performing a third annealing process.

12. The method of claim 1, wherein said at least one second circuit element comprises one or more resistors.

13. The method of claim 12, wherein each of said one or more resistors comprises an elongated line comprising said second semiconductor material.

14. The method of claim 13, wherein said elongated line is provided above a layer of an electrically insulating material.

15. The method of claim 14, wherein said layer of electrically insulating material is provided above a trench isolation structure.

16. The method of claim 1, wherein said at least one second circuit element comprises one or more second field effect transistors.

17. The method of claim 16, wherein a source region and a drain region of each of said one or more second field effect transistors comprise said second semiconductor material.

18. The method of claim 17, wherein a gate electrode of said second field effect transistor comprises said second semiconductor material.

19. The method of claim 16, wherein each of said one or more second field effect transistors has a greater gate length than each of said one or more first field effect transistors.

20. The method of claim 1, wherein said second portion of said dielectric layer completely covers each of said at least one second circuit element and substantially prevents a chemical reaction between said second semiconductor material and said metal in the entire at least one second circuit element.

21. The method of claim 1, wherein said second portion of said dielectric layer covers only a portion of each of said at least one second circuit element, and substantially prevents a chemical reaction between said second semiconductor material and said metal in the portion of each of said at least one second circuit element that is covered by said second portion of said dielectric layer.

22. The method of claim 8, wherein said ion implantation process is a first ion implantation process, the method further comprising performing a second ion implantation process to implant non-dopant ions into said first semiconductor material so as to form said at least one amorphous region.

23. The method of claim 22, wherein said second ion implantation process is performed before said first ion implantation process.

24. The method of claim 23, wherein said second ion implantation process is performed in the presence of said gate electrodes and prior to forming said sidewall spacers.

25. The method of claim 22, wherein said second ion implantation process is performed after said first ion implantation process, said entire outer sidewall surface of said sidewall spacer being exposed to said second ion implantation process.

26. A method, comprising:
    forming a gate electrode of a transistor element of a semiconductor structure above an active region comprising a semiconductor material of a substrate;
    forming an elongated line of a resistor element of said semiconductor structure above an isolation structure formed in said semiconductor material of said substrate;
    forming a sidewall spacer adjacent sidewalls of at least said gate electrode;
    performing a first implantation process to implant dopant ions into said active region laterally adjacent to said gate electrode so as to form source and drain regions of said transistor element;
    performing a second implantation process to implant non-dopant ions into said active region laterally adjacent to said gate electrode so as to form at least one amorphous material region in said active region, wherein an entire outer sidewall surface of said sidewall spacer is exposed to at least one of said first and second ion implantation processes;
    forming a dielectric material layer having an intrinsic stress above said transistor element and said resistor element, said dielectric material layer covering said entire outer sidewall surface of said sidewall spacer that was exposed to said at least one of said first and second implantation processes;
    performing an annealing process in the presence of said dielectric material layer to recrystallize said at least one amorphous material region, wherein recrystallizing said at least one amorphous material region comprises inducing an intrinsic stress in said semiconductor material of said active region; and
    after said annealing process, forming a metal silicide region in at least one of said source and drain regions and said gate electrode while masking said resistor element with a portion of said dielectric material layer.

27. The method of claim 26, wherein said entire outer sidewall surface of said sidewall spacer is exposed to both said first and second ion implantation processes.

* * * * *